United States Patent
Mauder et al.

(10) Patent No.: US 7,511,353 B2
(45) Date of Patent: Mar. 31, 2009

(54) SEMICONDUCTOR DIODE AND PRODUCTION METHOD SUITABLE THEREFOR

(75) Inventors: Anton Mauder, Kolbermoor (DE); Frank Hille, München (DE); Vytla Rajeev Krishna, Andhrapradesh (IN); Elmar Falck, Ottobrunn (DE); Hans-Joachim Schulze, Ottobrunn (DE); Franz-Josef Niedernostheide, Münster (DE); Helmut Strack, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/971,572

(22) Filed: Oct. 22, 2004

(65) Prior Publication Data

US 2005/0116249 A1    Jun. 2, 2005

(30) Foreign Application Priority Data

Oct. 24, 2003   (DE) .................. 103 49 582

(51) Int. Cl.
    *H01L 29/72* (2006.01)

(52) U.S. Cl. .............. 257/493; 257/551; 257/590; 257/596; 257/600; 257/618; 428/690

(58) Field of Classification Search .......... 257/528, 257/493, 551, 590, 596, 600, 618; 428/690
    See application file for complete search history.

(56) References Cited

U.S. PATENT DOCUMENTS

| 5,102,810 A | 4/1992 | Salih |
| 5,557,140 A * | 9/1996 | Nguyen et al. ............ 257/596 |
| 2005/0069727 A1* | 3/2005 | Gupta ....................... 428/690 |
| 2005/0244676 A1* | 11/2005 | Arakane et al. ............ 428/690 |

FOREIGN PATENT DOCUMENTS

| DE | 102 07 339 A1 | 9/2003 |
| DE | 102 40 107 A1 | 3/2004 |

* cited by examiner

*Primary Examiner*—Edward Wojciechowicz
(74) *Attorney, Agent, or Firm*—Maginot, Moore & Beck

(57) ABSTRACT

A semiconductor diode (30) has an anode (32), a cathode (33) and a semiconductor volume (31) provided between the anode (32) and the cathode (33). An electron mobility and/or hole mobility within a zone (34) of the semiconductor volume (31) that is situated in front of the cathode (33) is reduced relative to the rest of the semiconductor volume (31).

15 Claims, 8 Drawing Sheets

Anode　　　　　　　　　　　　Cathode

Anode　　　　　　　　　　　　Cathode

SEMICONDUCTOR DIODE AND PRODUCTION METHOD SUITABLE THEREFOR

BACKGROUND

The invention relates to a semiconductor diode and production method suitable therefor.

It is known that in the course of hard commutation of diodes, current chopping can occur in the diode. The consequence of such current chopping is that severe voltage or current oscillations occur. If such oscillations exceed maximum values that are permissible for the diode, then the diode may be destroyed. Destruction of the diode may also be caused by excessively severe interference effects on driving processes that are brought about by the current or voltage fluctuations, and resultant incorrect behavior of the driving processes. The problem area described above occurs particularly in the case of circuits with high leakage inductance, high currents (for example in the case of power semiconductors being connected in parallel in solid fashion) and in the case of high voltages with respect to which the diode is commutated.

A first possibility for preventing current chopping consists in reducing the current gradient in the course of the commutation of the diode. However, this leads to an increase in switch-on losses of the associated switch and is therefore undesirable.

A second possibility for preventing current chopping emerges from the following considerations: in order to build up a reverse voltage at the terminals of a diode, for example a $pn^{-n}$ diode, it is necessary to deplete a flooding charge (beginning at the pn junction). Since increasing the reverse voltage by $\Delta U$ is necessarily associated with the depletion of a charge packet $\Delta Q$ of the flooding charge, it is not possible, as long as sufficient flooding charge is present, for a diode reverse current to undergo chopping and for the reverse voltage to rise abruptly. Consequently, if sufficient flooding charge is present behind the end of the space charge zone at the end of a switching operation in the diode, current chopping can be prevented (the flooding charge diffuses apart and thereby still maintains a certain current flow). The presence of flooding charge furthermore has the effect that when a maximum reverse voltage is present, the diode reverse current does not immediately undergo chopping, whereby it is possible to avoid high current changes on account of the parasitic inductances always present and resultant voltage spikes at the diode. By increasing the diode thickness, equally there is also more flooding charge available for avoiding current chopping. What is disadvantageous about increasing the diode thickness, however, is that both the forward losses and the switching losses of the diode are increased.

The object on which the invention is based is to specify a semiconductor diode and a production method suitable therefor by means of which the disadvantages described above can be avoided.

SUMMARY

The semiconductor diode according to the invention has an anode, a cathode and a semiconductor volume. In this case, the semiconductor volume is provided between the anode and the cathode. What is essential is that an electron mobility and/or hole mobility within a zone of the semiconductor volume that is situated in front of the cathode is reduced relative to the rest of the semiconductor structure. The provision of such a zone with reduced electron/hole mobility brings about, on the one hand, an increased flooding charge in front of the cathode and, on the other hand, also a retarded extraction of the flooding charge during commutation of the diode.

The zone of reduced mobility preferably directly adjoins the cathode. As an alternative, the zone of reduced mobility is merely arranged in the vicinity of the cathode, i.e. a semiconductor region which does not have reduced electron mobility/hole mobility is situated between the zone of reduced mobility and the cathode.

In this case, "anode" and "cathode" are semiconductor regions adjoining the semiconductor volume and produce the ohmic contact with the metallization on the front- and rear-side surface of the diode. They serve as emitters and are responsible for flooding the semiconductor volume with the charge carriers (electrons, holes).

The zone of reduced mobility preferably has a parallelepipedal form and preferably also permeates the entire cross section of the semiconductor volume. This is not absolutely necessary, however; i.e. the entire cross section of the semiconductor structure need not be encompassed by the zone of reduced mobility. By way of example, it is possible for regions at the edge of the semiconductor volume not to be encompassed by the zone of reduced mobility. Generally, the zone of reduced mobility need not be a contiguous region.

The thickness of the zone of reduced mobility should not be greater than 60% of the thickness of the semiconductor volume itself. It has been found that thicknesses in a range of approximately one third to one quarter of the thickness of the semiconductor volume yields particularly good results. By way of example, a thickness of the zone of reduced mobility of approximately 20 to 40 µm yields good results in the case of a 1200 V diode. In particular, the total thickness of the semiconductor volume greatly depends on the required blocking capability of the diode, approximately 10 µm thickness being required per 100 volts of reverse voltage. Consequently, an expedient thickness of the zone of reduced mobility is approximately 2 to 4 µm per 100 volts of blocking capability of the diode. However, the invention is not restricted to these thickness ranges.

The semiconductor diode according to the invention may be a $pn^{-n}$ diode, for example, the electron mobility and/or hole mobility being reduced in the vicinity of an n-type emitter of the pn n diode. Of course, it is also possible for p-type and n-type regions to be interchanged with one another, i.e. for an $np^{-p}$ diode to be used.

The invention furthermore provides a method for producing the semiconductor diode according to the invention, having the following steps: irradiation of at least one part of the surface of the semiconductor volume of the semiconductor diode with high-energy particles, and annealing of the semiconductor structure. The zone of reduced mobility can be formed in the semiconductor volume by means of such irradiation.

The surface of the semiconductor structure (or a part thereof) is preferably irradiated with hydrogen ions and/or helium ions. In this case, the penetration depth of the high-energy particles into the semiconductor volume is regulated by varying the energy of said particles. If the irradiation of the semiconductor volume is effected such that particle beams permeate a cathode region of the semiconductor diode in the direction of an anode region of the semiconductor diode, the energy of the high-energy particles is chosen such that a penetration depth of the particle beams is approximately one third to one quarter of the thickness of the semiconductor volume. It is thus possible to produce a zone of reduced mobility which directly adjoins the cathode of the semiconductor diode.

The annealing of the irradiated semiconductor volume is preferably effected at temperatures of between 360° C. and 700° C. However, the invention is not restricted to this temperature range. If a field stop layer is intended to be produced at the same time by means of the irradiation, it is advantageous to effect irradiation with protons and to keep the annealing temperature below 550° C. By contrast, if only the zone of reduced mobility is intended to be formed by means of the proton irradiation, then annealing temperatures of above 600° C. are advantageous. In this case, the duration of the annealing process is typically between 0.5 and 10 hours, but may also be longer or shorter.

BRIEF DESCRIPTION OF THE DRAWINGS

The invention is explained in more detail below in exemplary embodiments with reference to the accompanying figures, in which.

DESCRIPTION

In order to provide a better understanding of the invention, the technical environment of the invention shall be explained in more detail below with reference to FIGS. 1 and 2.

As has already been mentioned, in the diode according to the invention, the intention is to increase a flooding charge in front of the cathode of the diode in a targeted manner and at the same time to slow down the depletion of the flooding charge during the commutation operation.

Figure 1:
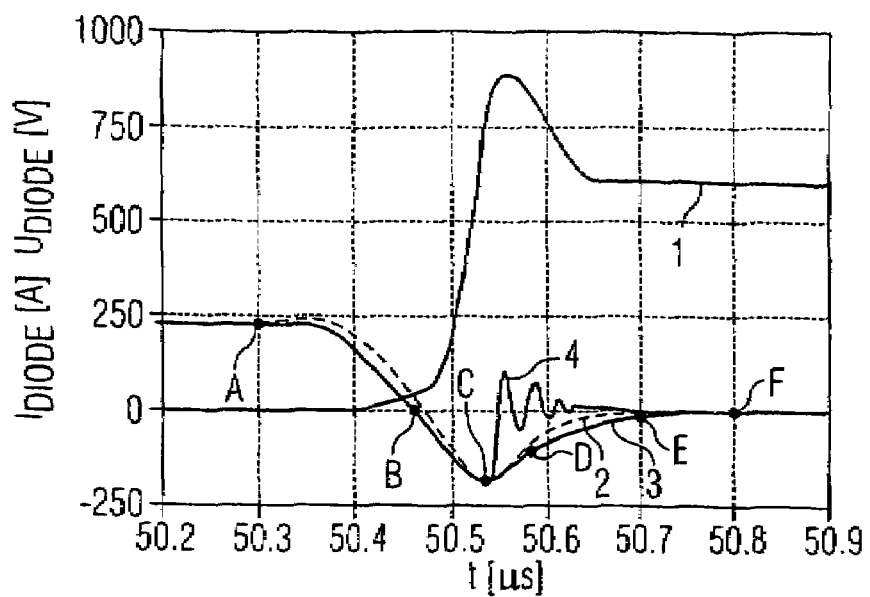
FIG. 1 shows the commutation behavior of a conventional 1200 V diode with a rated current of 450 A and an intermediate circuit voltage of 600 V.
Figure 2:
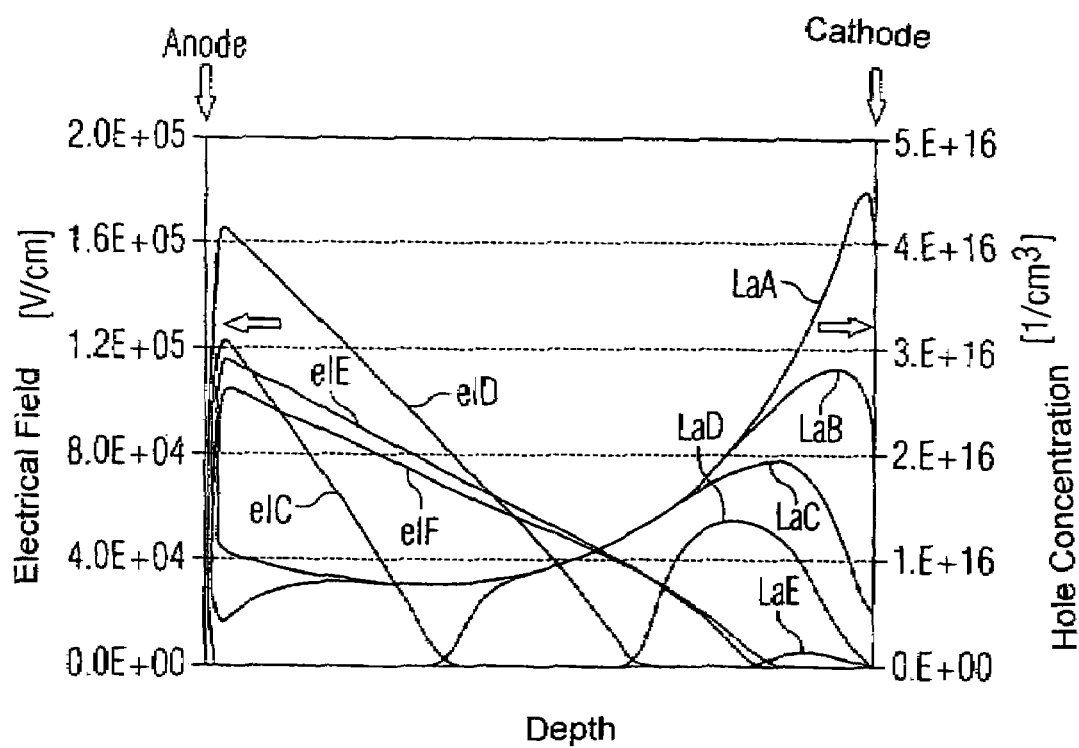
FIG. 2 shows electric field distributions and also associated flooding charge distributions for the diode shown in FIG. 1.

In FIG. 1, a measured voltage profile 1, a measured current profile 2 and also a simulated current profile 3 during a commutation operation are plotted against time. Furthermore, FIG. 1 shows a current chopping profile 4, which occurs in the case of a diode that is not dimensioned in accordance with the invention. The semiconductor diode according to the invention is intended to avoid such a current chopping profile 4 even under less favorable switching conditions than those illustrated in FIG. 1, and instead to have a current profile corresponding to the current profile identified by reference symbols 2 and 3. Less favorable (so-called "hard") switching conditions with regard to current chopping are when the diode is operated either with higher intermediate circuit voltage, higher leakage inductance, higher current gradient during commutation or a combination of these influencing factors.

FIG. 1 furthermore shows six instants A to F. Corresponding profiles of electric field strength and flooding charge are present within the semiconductor diode at these instants, said profiles being shown in part in FIG. 2: the distributions of the flooding charges corresponding to the instants A to E are identified by the reference symbols LaA to LaE, the profiles of the electric field strength corresponding to the instants C to F being identified by the reference symbols elC to elF.

Figure 3:
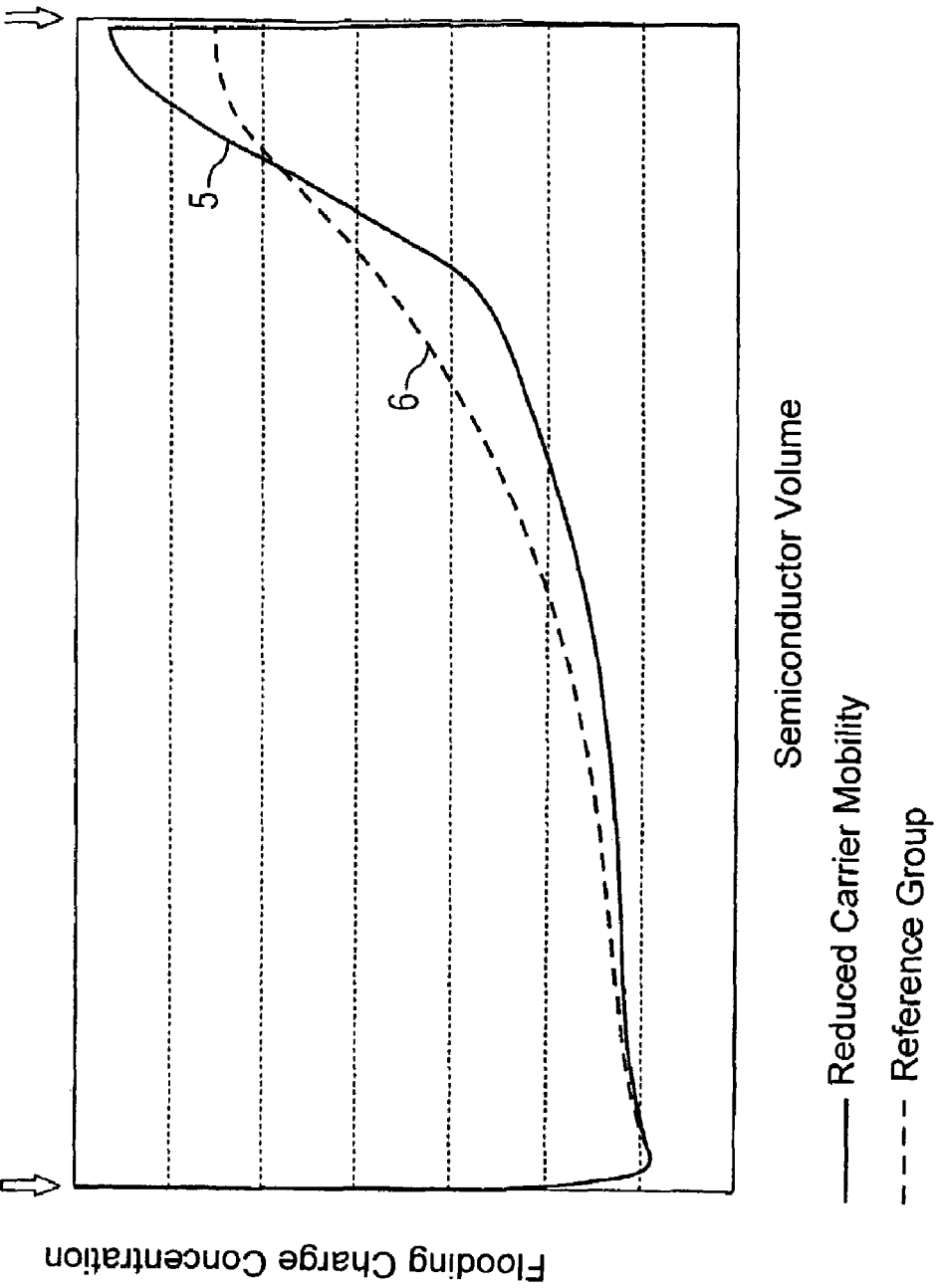
FIG. 3 shows concentration distributions of flooding charges for a diode according to the invention and a conventional diode.

FIG. 3 shows a first flooding charge concentration profile 5, which occurs in a semiconductor diode according to the invention, and also a second flooding charge concentration profile 6, which is characteristic of a conventional semiconductor diode. In this case, it can clearly be seen that the flooding charge concentration of the semiconductor diode according to the invention in the region near the cathode is increased compared with the flooding charge concentration of conventional diodes. The differences in the flooding charge concentration profiles 5 and 6 can be attributed to the fact that, in the semiconductor diode according to the invention, an electron mobility and/or hole mobility within a zone of the semiconductor volume that is situated in front of the cathode and lies between the anode and the cathode is reduced relative to the rest of the semiconductor volume.

Figure 4:
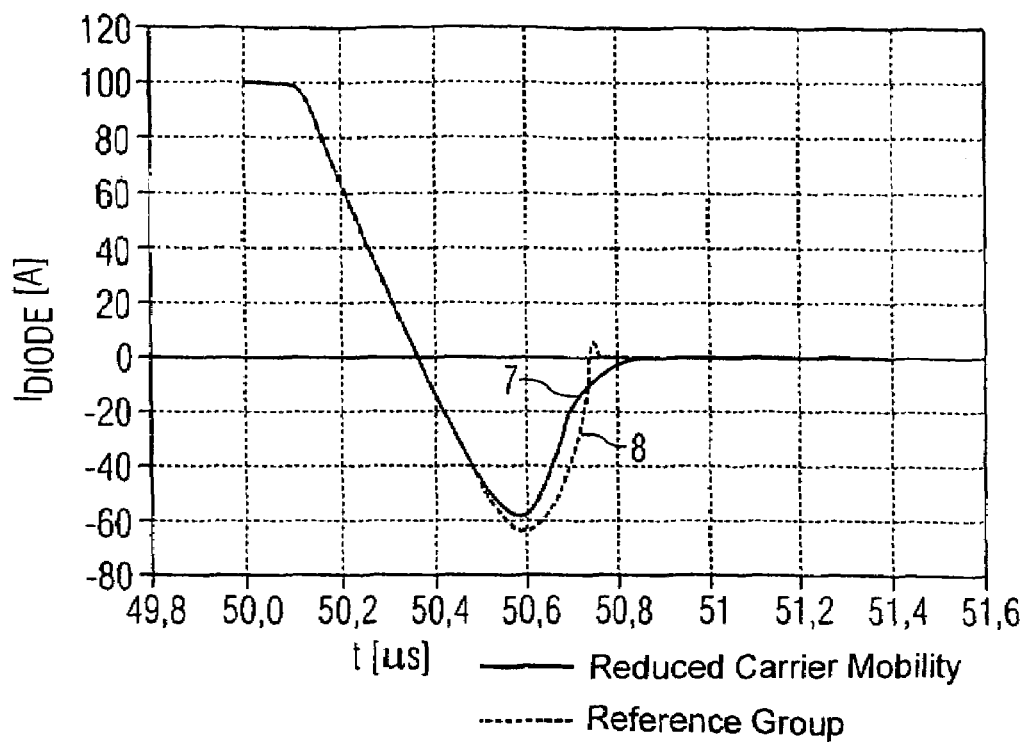
FIG. 4 shows current profiles of the diodes characterized in FIG. 3.
Figure 5:
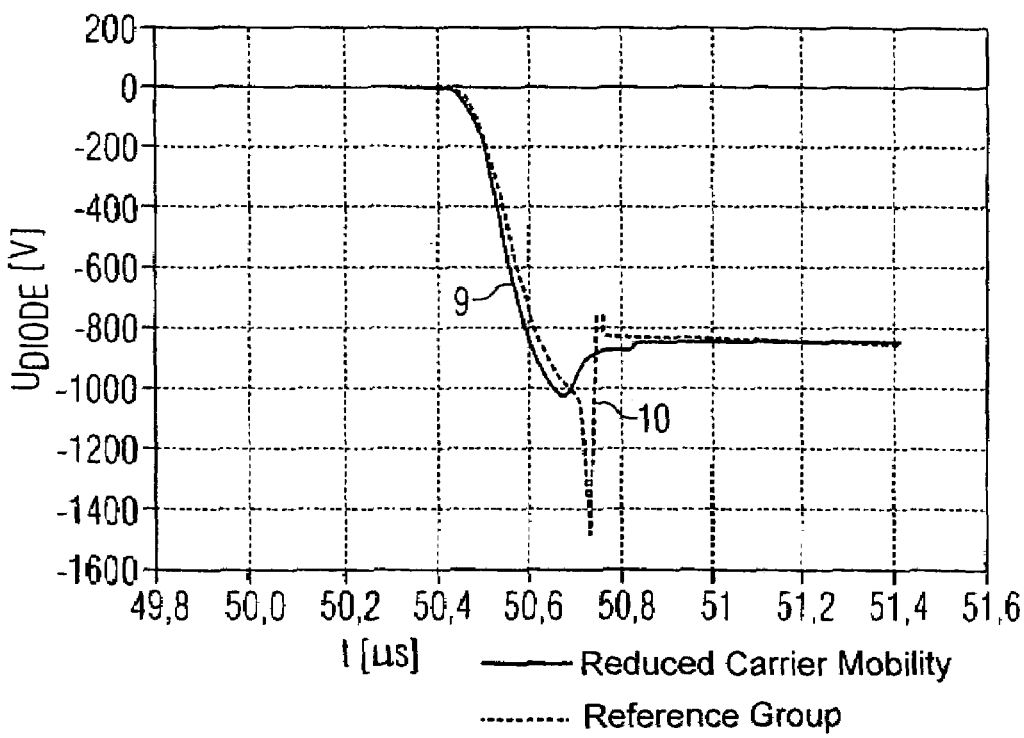
FIG. 5 shows voltage profiles of the diodes characterized in FIG. 3.

FIG. 4 shows a first current profile 7 and also a second current profile 8, the first current profile 7 corresponding to the current profile of the semiconductor diode (with reduced carrier mobility) according to the invention characterized in FIG. 3, whereas the second current profile 8 corresponds to the current profile of the conventional semiconductor diode characterized in FIG. 3. Analogously to this, FIG. 5 shows a first voltage profile 9 and a second voltage profile 10, the first voltage profile 9 corresponding to the voltage profile of the semiconductor diode according to the invention characterized in FIG. 3, and the second voltage profile 10 corresponding to the voltage profile of the conventional diode from FIG. 3. The current/voltage profiles shown in FIGS. 4 and 5 occur under "hard" switching conditions and show that, in the case of a conventional diode, it is highly probable that such extreme voltage values would occur that the diode would be destroyed.

Figure 6:
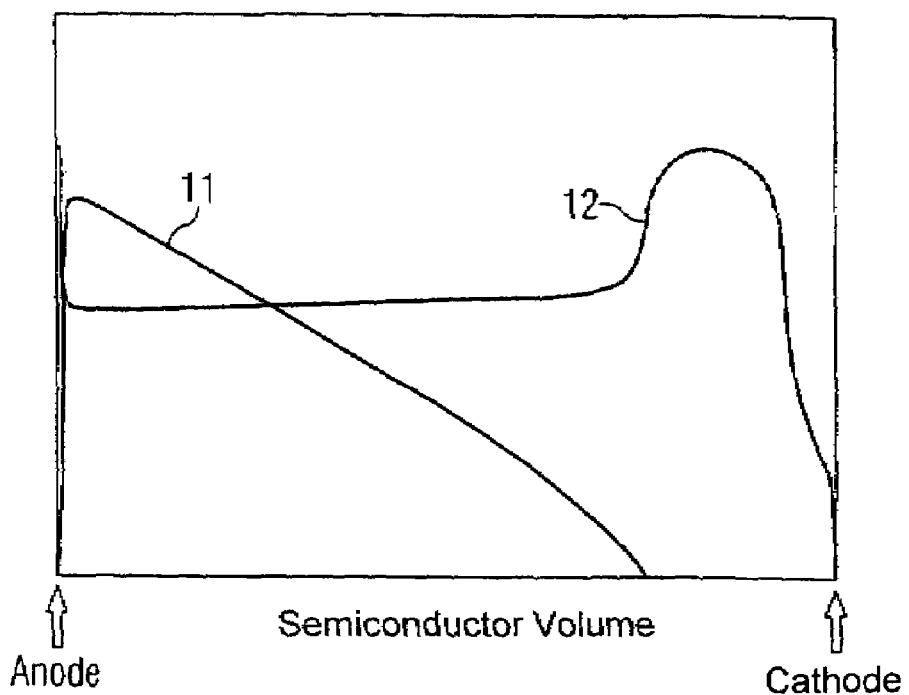
FIG. 6 shows profiles of electric field strength and charge carrier concentration of the conventional diode characterized in FIG. 3 at the instant of the reverse current spike shown in FIGS. 4 and 5.
Figure 7:
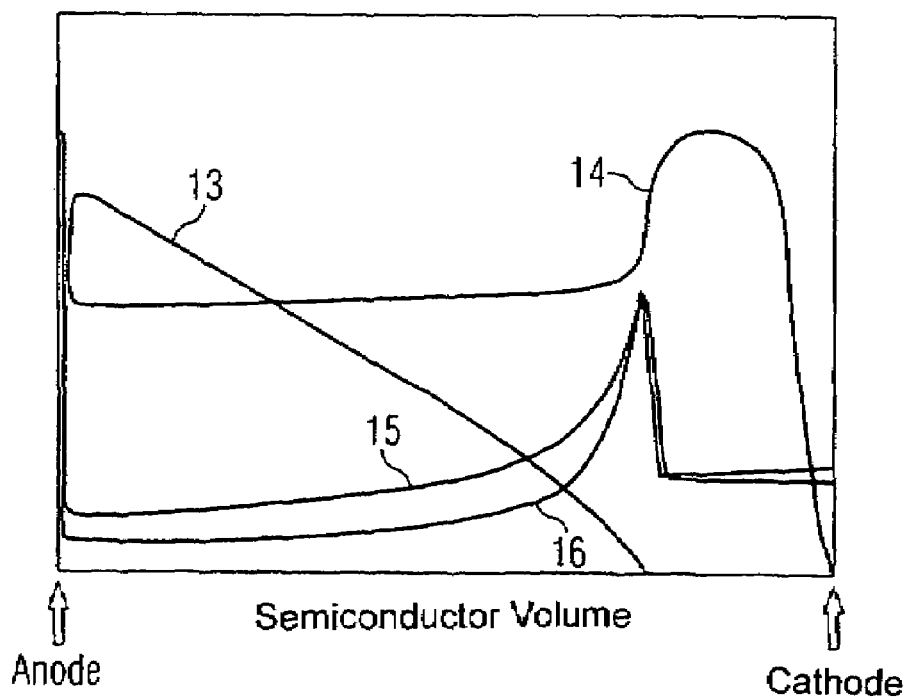
FIG. 7 shows profiles of electric field strength and charge carrier concentration of the diode according to the invention characterized in FIG. 3 at the instant of the reverse current spike shown in FIGS. 4 and 5.

FIG. 6 shows a profile of an electric field strength 11 and also a flooding charge concentration profile 12 corresponding thereto of the conventional semiconductor diode from FIG. 3. In comparison therewith, FIG. 7 shows a field strength profile 13 and also a flooding charge concentration profile 14 corresponding thereto. Furthermore, FIG. 7 shows the magnitude of an electron carrier mobility 15 and also the magnitude of a hole carrier mobility 16. The profiles 13 to 16 shown in FIG. 7 are those of the semiconductor diode according to the invention from FIG. 3. The profiles shown in FIGS. 6 and 7 occur at the instant of the current/voltage spikes (reverse current spike) shown in FIGS. 4 and 5. If the profiles from FIGS. 6 and 7 are compared with one another, then it can be seen that a significantly higher concentration of flooding charge occurs in the region near the cathode in the case of the semiconductor diode according to the invention.

Figure 8:
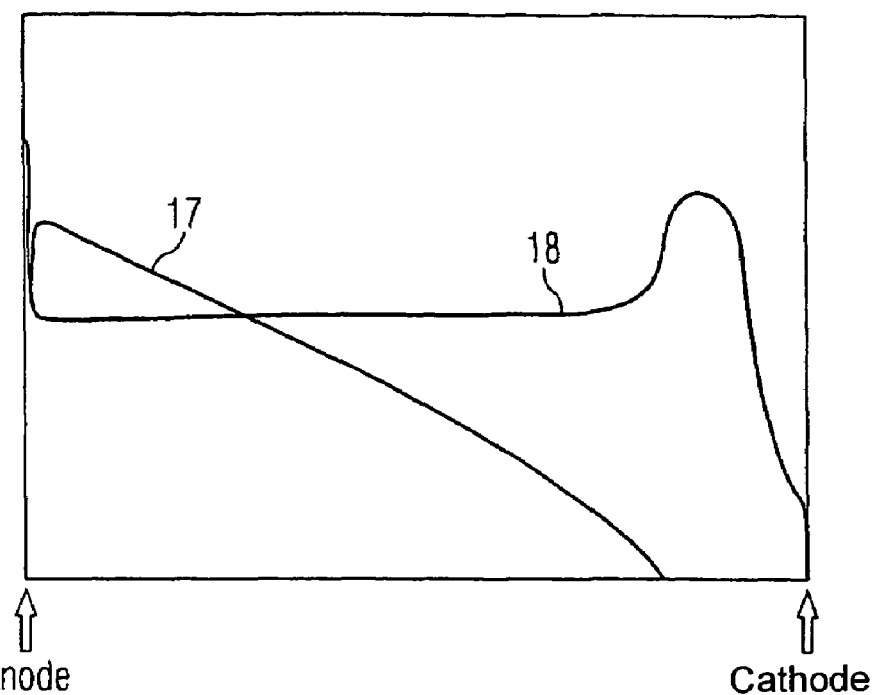
FIG. 8 shows profiles of electric field strength and charge carrier concentration of the conventional diode characterized in FIG. 3 directly before the current chopping shown in FIGS. 4 and 5.
Figure 9:
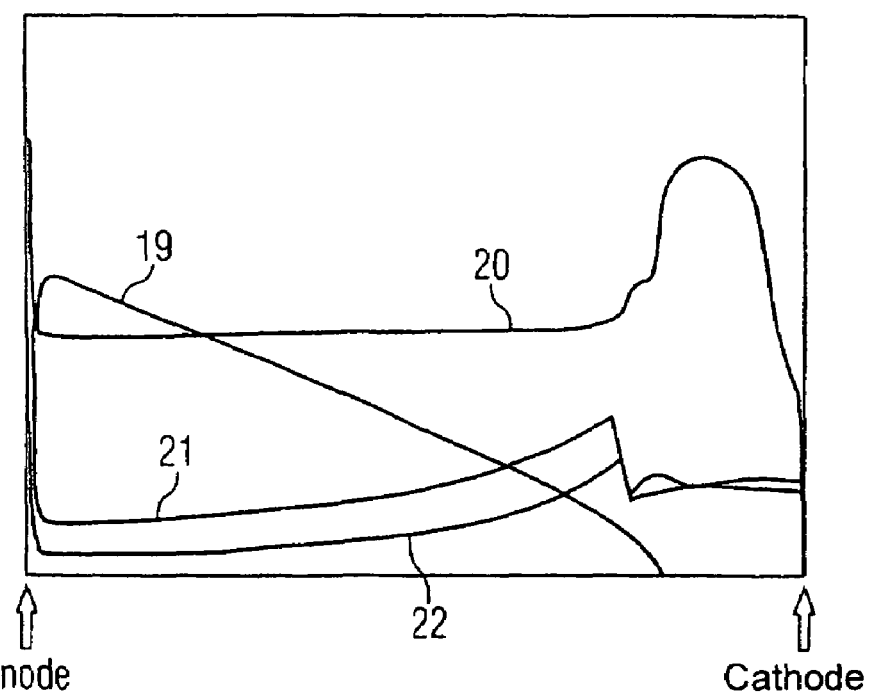
FIG. 9 shows profiles of electric field strength and charge carrier concentration of the diode according to the invention characterized in FIG. 3 directly before the current chopping shown in FIGS. 4 and 5.

FIG. 8 shows a field strength profile 17 and also a flooding charge concentration profile 18 of the conventional semiconductor diode characterized in FIG. 3. Analogously to this, FIG. 9 shows a field strength profile 19, a flooding charge concentration profile 20 and also a magnitude of the carrier mobility of the electrons 21 and also a magnitude of the carrier mobility of the holes 22. The profiles shown in FIG. 9 correspond to the semiconductor diode according to the invention characterized in FIG. 3. The profiles shown in FIGS. 8 and 9 represent the profiles occurring directly before the current chopping shown in FIGS. 4 and 5 (i.e. directly before the voltage spike shown in FIGS. 4 and 5). If FIGS. 8 and 9 are compared with one another, then it can be seen that a significantly higher flooding charge concentration profile occurs in the region near the cathode of the semiconductor diode according to the invention than in the conventional diode.

Figure 10:
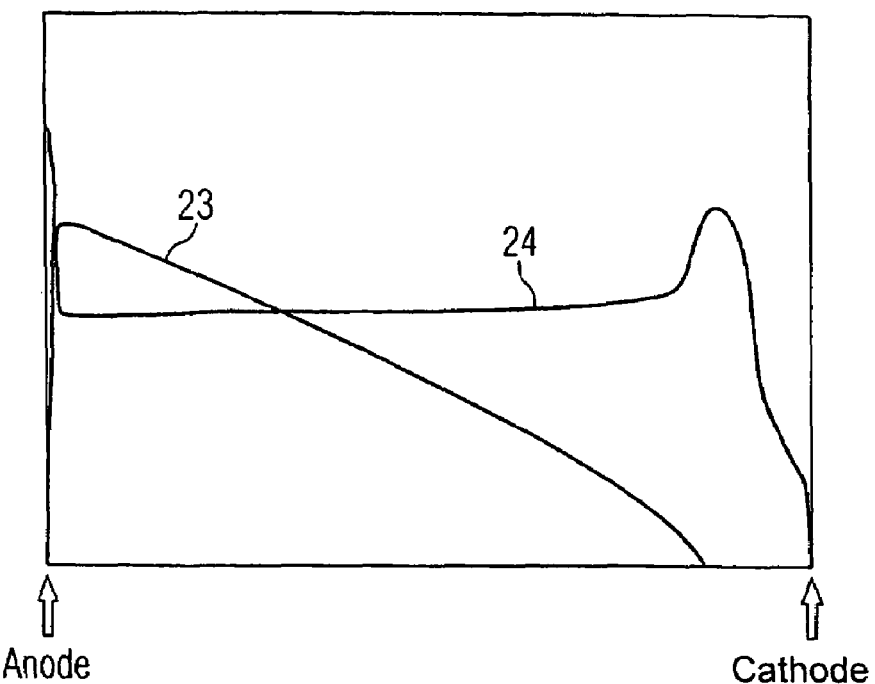
FIG. 10 shows profiles of electric field strength and charge carrier concentration of the conventional diode characterized in FIG. 3 at the instant of the current chopping shown in FIGS. 4 and 5.
Figure 11:
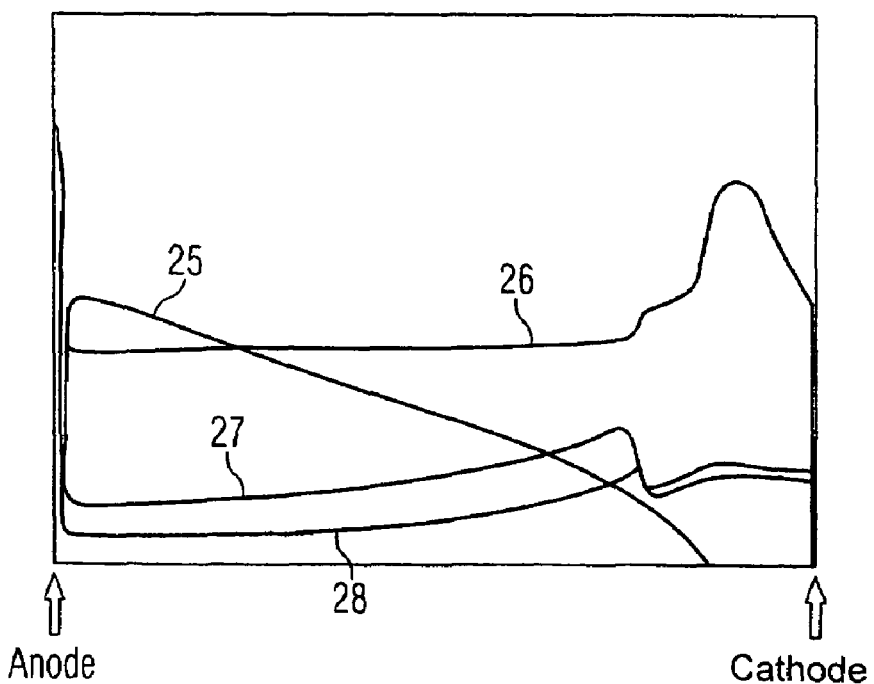
FIG. 11 shows profiles of electric field strength and charge carrier concentration of the diode according to the invention characterized in FIG. 3 at the instant of the current chopping shown in FIGS. 4 and 5.

FIG. 10 shows a profile of an electric field strength 23 and also a flooding charge concentration profile 24 of the conventional diode characterized in FIG. 3 at the instant of current chopping of the conventional diode. Analogously to this, FIG. 11 shows a profile of the electric field strength 25, a flooding charge concentration profile 26, a magnitude of the carrier mobility of the electrons 27 and also a magnitude of the carrier mobility of the holes 28 in the semiconductor diode according to the invention characterized in FIG. 3 at the instant of the current chopping of the conventional diode characterized in FIG. 3. If FIGS. 10 and 11 are compared with one another, then it can be seen that the semiconductor according to the invention has a higher flooding charge concentration in the region near the cathode compared with the conventional diode.

To summarize, it can thus be established that the semiconductor diode according to the invention has, at any point in time, a higher flooding charge concentration in the region near the cathode compared with the conventional semiconductor diode. It is thus possible to avoid the occurrence of current chopping with an otherwise unchanged diode thickness.

Further details concerning the technical background of the invention will be explained below.

As has become evident from the above, the aim of the invention is to increase the flooding charge in front of the cathode in a targeted manner and at the same time to slow down the reduction of said charge in a targeted manner during commutation without changing the chip thickness. FIG. 1 shows, in curves 2 and 3, the commutation behavior of a conventional 1200 V diode which exhibits current chopping under relatively hard switching conditions. FIG. 2 illustrates the electric field strength and the flooding charge at the instants specified in FIG. 1.

A sufficiently high concentration of the flooding charge in front of the cathode of the diode shown in FIG. 1 could be provided by increasing the edge concentration (in the region near the cathode) at the instant "A". However, in practice very narrow limits are imposed on this edge concentration since it depends not only on the emitter efficiency of the cathode emitter but also on the maximum gradient of the carrier flooding. The latter is crucially determined by the flowing current density. In other words: for a given current density, the gradient of the carrier flooding is predetermined, and thus so is the edge concentration, independently of the cathode emitter used, as soon as the latter exceeds a certain efficacy. Consequently, it is not possible to control the softness of a sufficiently thin diode solely by means of the efficacy of the cathode emitter.

The invention proposes reducing the electron and hole mobility preferably in a zone up to approximately one third to one quarter of the chip thickness from the cathode in order to achieve a sufficient softness under hard switching conditions (see FIG. 3, which illustrates a vertically resolved concentration of the carrier flooding of a diode according to the invention in comparison with a conventional diode, the two diodes having both local and homogeneous carrier lifetime setting). That is 20 to 40 µm in the example for a 1200 V diode. This measure leads both to an increased flooding charge in front of the cathode and to a retarded extraction of said charge during commutation. The combination of these two effects is essential for achieving the softness and is described in more detail below:

In the on-state case, in the base zone of the diode, a large part of the impressed current is carried as diffusion current. Reducing the mobilities in front of the cathode thus leads to the decrease in the ambipolar diffusion constant in front of the cathode. In order to be able to drive a diffusion current of the same magnitude, it is necessary to produce a steeper gradient in the charge carrier density. Provided that the emitter efficiency of the cathode is sufficiently high, this then also leads to a raising of the charge carrier density in front of the cathode. FIG. 3 shows two identically dimensioned diodes with an identical local lifetime dip in front of the cathode, which differ distinctly from one another, however, with regard to the gradient of the carrier flooding.

If the switching of these diodes under hard switching conditions is now compared (see FIGS. 4 and 5), then the conventionally dimensioned diode undergoes such severe chopping that in reality it would extremely probably be destroyed.

The reason for the softer switching of the diode with reduced carrier mobility resides, however, not just in the more favorable initial carrier distribution, as illustrated in FIG. 3.

Rather, the reduced carrier mobility protects the excess charge near the cathode from premature extraction. The effect of the mobility reduction takes effect as soon as the electric field reaches the zone of low mobility during the commutation operation.

Directly at the space charge zone boundary, the electric field strengths are still low (no saturation velocity of the holes), so that a slower extraction of the holes toward the anode, or a slower du/dt, ensues from the reduced mobility. At the same time, in order to maintain the reverse current, a steeper gradient of the carrier concentration toward the space charge zone must prevail than in the case with high mobility. In the entire component, the same current density must flow and this current can predominantly only flow as diffusion current at the edge of the residual region flooded with carriers because, for a high drift current portion, on the one hand not enough carriers are available (in contrast to the high degree of flooding), and on the other hand high field strengths as in the space charge zone, which enable a high drift current density with only a low carrier density, also cannot prevail on account of the residual carriers. A reduction of the residual maximal carrier flooding by means of a shallower gradient as in the reference case with high mobility therefore also does not take place. Since charge neutrality must prevail, a slow extraction of the electrons toward the cathode also automatically ensues. Thus, overall more charge remains in front of the cathode.

The retarded extraction even goes so far as to enable compensation of a momentary removal of the flooding charge from the cathode (see FIG. 11). Since the residual load current predominantly flows as diffusion current at the cathodal end of the flooded zone as well and this load current comes low on account of the retarded depletion, this also influences the gradient of the carrier flooding toward the cathode. This gradient must be low in order to match the low diffusion current density adapted to the retarded depletion. In order, then, to set this low gradient, the depleted region in front of the cathode must be filled again by diffusion of charge carriers. During the hard switching of a conventional diode, by contrast, the extraction process of electrons and holes takes place in such a way that the residual excess charge breaks away from the cathode and is immediately extracted via the extent of the space charge zone.

Suitable methods for locally reducing the carrier mobility in front of the cathode are, in addition to irradiation techniques, for example partly compensating dopings both with donors and acceptors.

The numerical values specified apply in particular to a diode with 1200 V rated blocking capability. It goes without saying that the technology is also suitable for other rated voltages, dopings and dimensionings having to be correspondingly scaled. Specified penetration depths and dimensions of 1200 V have to be scaled to the corresponding final thicknesses.

Reducing the carrier mobility in front of the cathode emitter achieves a greater carrier increase at the cathode and at the same time a slower extraction of this charge, which leads to the softer switching behavior.

In order to produce the semiconductor diode described above, at least one part of the surface of the semiconductor volume that is situated between the anode and the cathode of the semiconductor diode is irradiated with high-energy particles, and an annealing step is subsequently carried out.

Figure 13:
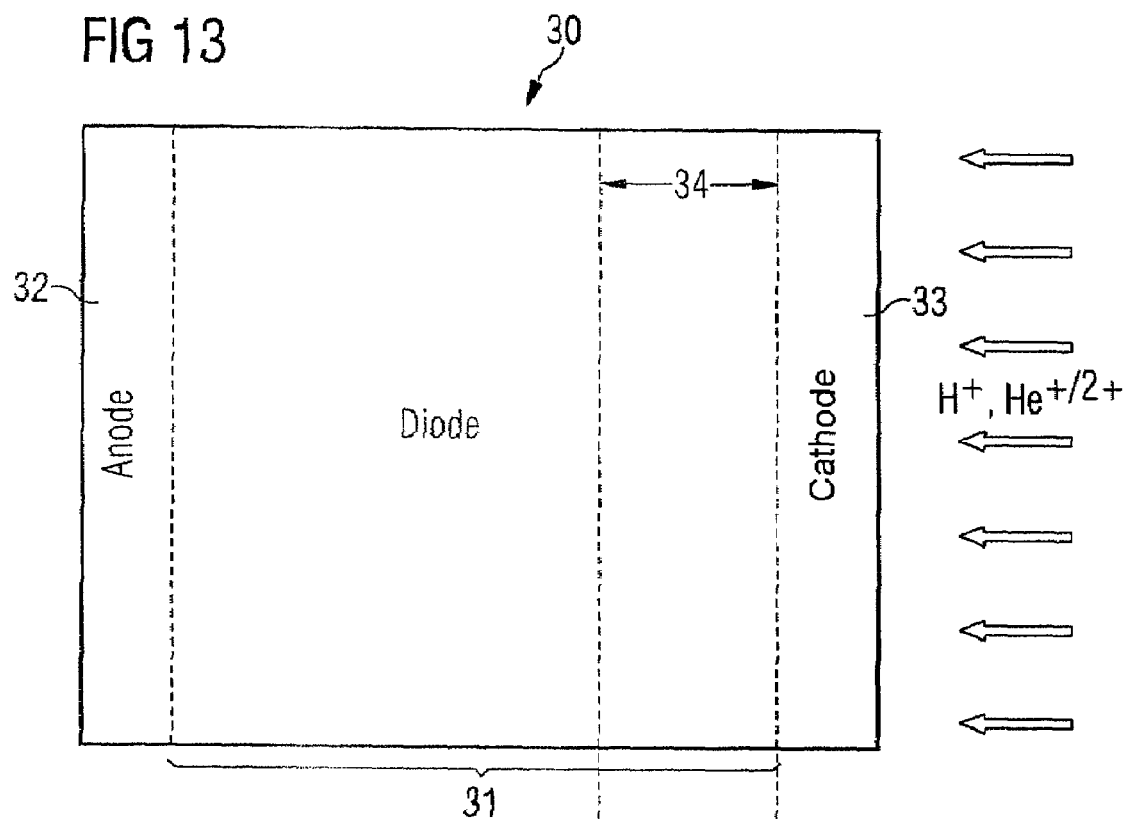
FIG. 13 shows a schematic diagram for elucidating a particularly preferred embodiment of the production method according to the invention.
Figure 14:
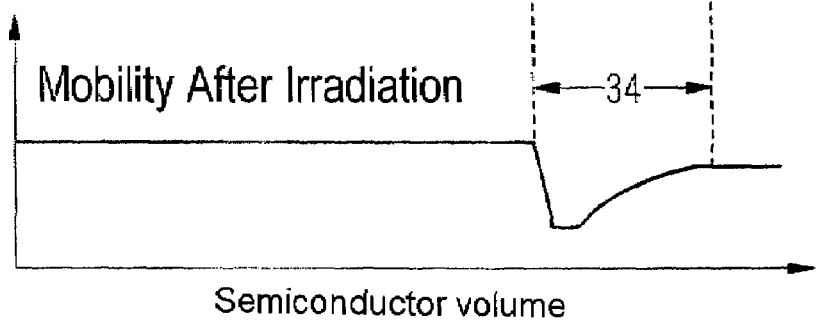
FIG. 14 shows a preferred profile of the electron mobility/hole mobility in a diode according to the invention.

A preferred embodiment of this production method is shown in FIG. 13. In this exemplary embodiment, a semiconductor volume 31 of a diode 30 situated between an anode or an anode region 32 and a cathode or a cathode region 33 is irradiated with protons or He ions from the cathode side. This irradiation operation has the effect that an electron mobility or hole mobility within a zone 34 of the semiconductor volume 31 that is situated in front of the cathode region 33 is reduced relative to the rest of the semiconductor structure 31, as is shown in FIG. 14. The mobility within the cathode region 33 is likewise inevitably reduced by an irradiation from the cathode side. This is not very significant, however, due to the comparatively small extent of the cathode region 33 into the depth. The irradiation may likewise have the effect of altering the emitter efficiency of the cathode region 33. This may be compensated for, if appropriate, by process parameters adapted to the emitter.

Figure 12:
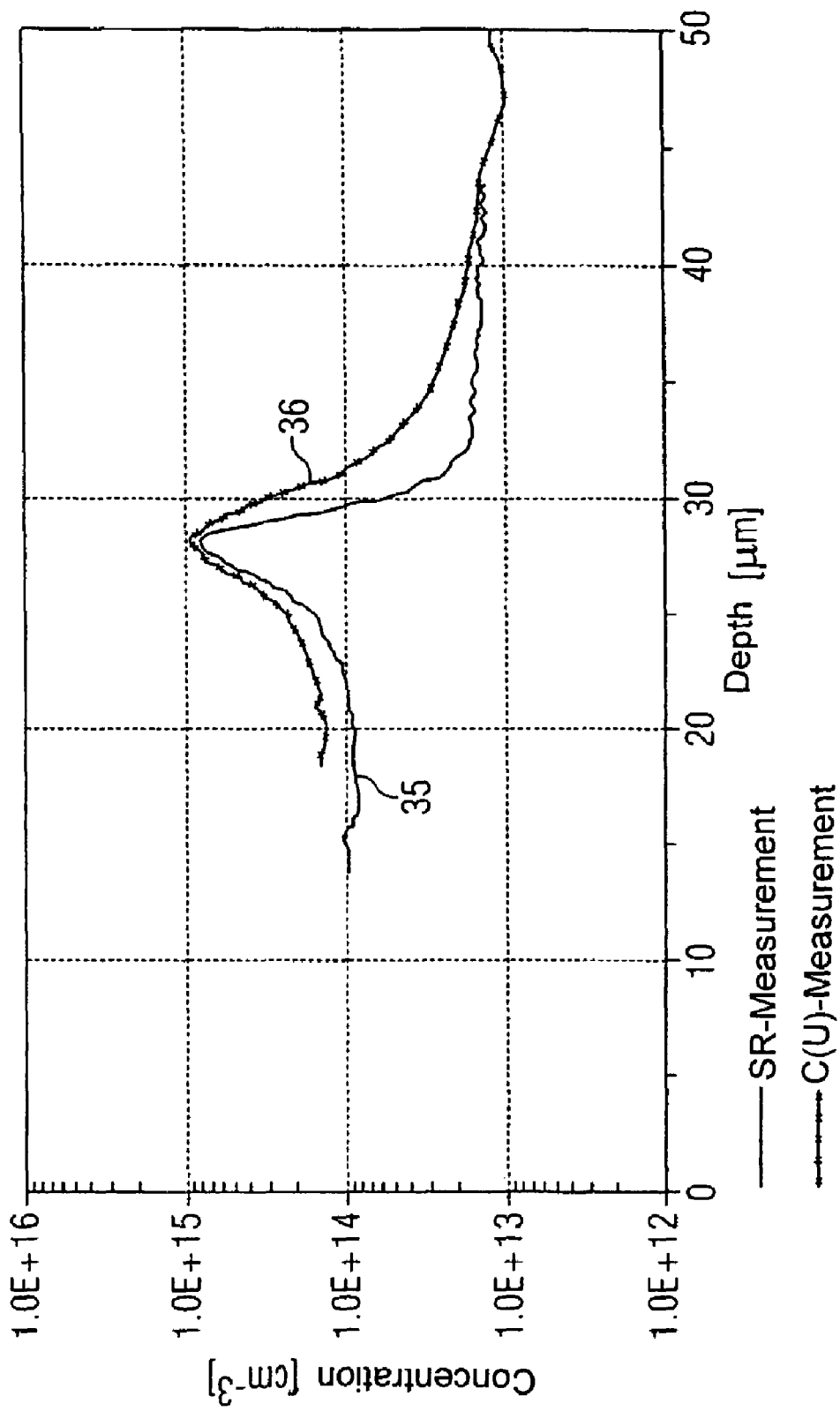
FIG. 12 shows profiles of doping concentrations in a diode according to the invention.

The irradiation process shown in FIG. 13 serves for producing the zone of reduced mobility 34. The reduced mobility of electrons or holes within the zone of reduced mobility 34 is effected by an increased concentration of scattering centers relative to the rest of the semiconductor volume 31, which scattering centers can be controlled by the irradiation process. In a diode according to the invention, the mobility reduction may also be produced by means of a proton irradiation with a subsequent heat treatment step. By virtue of the n-doping effect of the proton irradiation, it is possible to combine the mobility reduction with the production of a field stop doping—which is often also required—in one process step. Such a doping concentration profile is shown in FIG. 12. The doping concentration profile 36 was determined by means of a capacitive measurement (C(U) measurement) and specifies the density of the donors. In comparison therewith, a determination of a doping concentration profile by means of resistance measurements 35 (spreading resistance measurement) exhibits lower values, which are attributable to the fact that the conversion to the dopant concentration was effected via the charge carrier mobilities of undisturbed silicon. However, since the mobility was reduced by the irradiation, the lower doping is suggested in the resistance measurement.

According to the invention, the intention is to realize a zone of reduced mobility in the vicinity of the n-type emitter or p-type emitter of $pn^{-n}$ diodes or $np^{-p}$ diodes, respectively, in order to realize a softer turn-off behavior of these components.

It is proposed to reduce the mobility in a well-defined region in the vertical direction by employing a proton irradiation which is subsequently subjected to an annealing step of temperatures of between 360° C. and 700° C. The duration of this annealing process may typically be between 30 minutes and 10 hours. The annealing temperature is defined in particular from the standpoint of whether an n-doped stop zone is simultaneously to be produced by the proton irradiation. If the proton irradiation is simultaneously used to produce a field stop doping, then preferred annealing temperatures are between 360° C. and 450° C. By contrast, if only the charge carrier mobility is to be reduced without obtaining an appreciable doping effect, then preferred temperatures are between 580° C. and 700° C. The preferred duration of such heat treatment processes is between 60 and 240 minutes. However, the invention is not restricted to such ranges.

The desired intensity for mobility reduction may be effected by way of the irradiation dose, but also by way of the choice of annealing temperature. Typical irradiation doses lie in the range of between $5\times10^{11}$ cm$^{-2}$ and $5\times10^{14}$ cm$^{-2}$. However, the invention is not restricted to this range. Irradiation doses higher than $5\times10^{14}$ cm$^{-2}$ may also be used, which are expediently combined with relatively high heat treatment temperatures in order to avoid the effect of shortening carrier lifetimes of such high irradiation doses and at the same time to achieve a dosing effect that is not too high. An excessively heavily doped field stop would likewise contribute to premature current chopping. At irradiation doses significantly lower than $5\times10^{11}$ cm$^{-2}$, the effects of the irradiation on mobility and/or doping are too small to influence the switching behavior.

The comparison of doping profiles (see FIG. 12) determined by means of the "spreading resistance" method (which is a measure of the resistivity that is influenced by the mobility) and the C(U) method (which yields the actual doping, uninfluenced by the mobility) shows that the mobility is noticeably reduced both in the irradiated region and in the so-called "end of range" of the proton irradiation. This means that the vertical extent of this layer with reduced mobility can be controlled by way of the choice of implantation energy. The reduction of the mobility in the case of the example illustrated in FIG. 12 amounts to approximately 50% in the irradiated region and approximately 20% in the peak region. One reason why the mobility reduction turns out to be lower in the peak region might reside in the fact that vacancies are taken up for donor formation and can thus no longer contribute to the production of mobility-reduced vacancy clusters.

Instead of proton irradiation, it is also possible to employ helium irradiation, in which case significantly higher energies are required to produce the same penetration depth and, of course, the hydrogen-induced donor effect is also obviated.

Thus, one essential aspect of the production method according to the invention is a targeted reduction of the mobility of free charge carriers by irradiation with high-energy particles, such as e.g. protons, in conjunction with a suitable annealing step.

The principle proposed is illustrated schematically in FIG. 13. In order to reduce the mobility only in the region near the cathode, the diode is irradiated with protons or He ions from the cathode side. The diode may also be irradiated from another side, for example in a direction perpendicular to the paper plane. In this case, the energy of the particles is chosen for e.g. 1200 V diodes preferably such that the penetration depth of the particles in the silicon approximately corresponds to one quarter to one third of the total wafer depth (thickness of the semiconductor volume 31). If the proton irradiation is simultaneously to be used for producing a field stop layer by also utilizing its doping effect, then it may be expedient, particularly in the case of components that effect even higher blocking (into the region of 13 kV), to choose the penetration depth from the range of between one tenth and one fifth of the wafer thickness. See F.-J. Niedemostheide, H.-H. Schulze, U. Kellner-Werdehausen, R. Barthelmess. J. Przybilla, R. Keller, H. Schoof, D. Pikorz. "13 kV Rectifiers: Studies on Diodes and Asymmetric Thyristors", Proc. ISPSD'03, Cambridge, UK. Apr. 14-17, 2003, pp. 122-125.

One essential aspect of the invention is that the regions near the anode exhibit a high carrier mobility which leads to the shallow carrier gradients—expedient on the anode side—while the region near the cathode exhibits the high carrier concentration required for softness in conjunction with low mobilities. If the low mobility is present over the entire semiconductor volume, then higher forward losses are primarily to be expected, while the turn-off behavior is not improved any further. At penetration depths smaller than 10% of the wafer thickness, the carrier flooding near the cathode is already depleted early on during the switching operation (see, for example, the curve "LaD" in FIG. 2, so that the desired effect is rather weakly pronounced.

Finally, it should also be noted that the irradiation methods proposed in German patent application 10207 339.2, entitled "Method for reducing the mobility of free charge carriers in a semiconductor body", aim to reduce the charge carrier mobility in the region near the anode in which the field strength distribution has its maximum upon the formation of the space charge zone depleted of charge carriers. This irradiation aims to raise the breakdown voltage of the diodes by reducing the mobility. By contrast, the irradiation variant proposed here aims to reduce the mobility of the charge carriers in the region near the cathode in order thereby to slow down the reduction of the plasma zone in front of the cathode during the commutation operation and in this way to avoid excessively large current gradients at the end of the commutation operation. It is also conceivable to combine the two methods with one another.

The minimum thickness of the semiconductor volume is limited by the blocking capability and the doping. If the mobility is reduced at the anode (as proposed in German patent application 10207 339.2), then it is possible to achieve higher values for the electric field strength from which avalanche multiplication commences in Si. Consequently, it is possible to achieve a higher reverse voltage for the same thickness and basic doping—or in turn the same blocking capability with a higher basic doping.

The softness of a diode becomes better if it has a relatively high basic doping and the space charge zone thus does not reach as far into the semiconductor volume from the anode. The electric field strength decreases in the space charge zone with greater distance from the anode, so that, above a certain distance from the anode, a reduced mobility has no influence on the blocking capability of a diode.

All the n-type regions and p-type regions may, of course, be interchanged with one another in all the embodiments described, i.e. the embodiments may be doped inversely.

LIST OF REFERENCE SYMBOLS

1 Measured voltage profile
2 Measured current profile
3 Simulated current profile
4 Current chopping profile
A to F First to sixth instants
LaA to LaE Charge distributions corresponding to the instants A to E
elB to elF Profiles of the electric field strength corresponding to the instants C to F
5 First flooding charge concentration profile
6 Second flooding charge concentration profile
7 First current profile
8 Second current profile
9 First voltage profile
10 Second voltage profile
11 Field strength profile
12 Flooding charge concentration profile
13 Field strength profile
14 Flooding charge concentration profile
15 Magnitude of the carrier mobility of the electrons
16 Magnitude of the carrier mobility of the holes
17 Field strength profile
18 Flooding charge concentration profile
19 Field strength profile
20 Flooding charge concentration profile
21 Magnitude of the carrier mobility of the electrons
22 Magnitude of the carrier mobility of the holes
23 Field strength profile
24 Flooding charge concentration profile
25 Field strength profile
26 Flooding charge concentration profile
27 Magnitude of the carrier mobility of the electrons
28 Magnitude of the carrier mobility of the holes
30 Diode
31 semiconductor volume
32 anode region or anode
33 cathode region or cathode
34 zone of reduced mobility
35 first doping concentration profile
36 second doping concentration profile

The invention claimed is:

1. A high voltage semiconductor diode comprising:
an anode;
a cathode; and
a semiconductor volume provided between the anode and the cathode;
wherein a total thickness of said semiconductor volume between said anode and said cathode corresponds to the blocking capability of the diode in a ratio of approximately 10 µm thickness per 100 volts of reverse voltage blocking capability; and
wherein electron mobility or hole mobility within a zone of the semiconductor volume that is situated in front of the cathode is reduced relative to electron mobility or hole mobility of the rest of the semiconductor volume, and wherein a thickness of the zone in the direction extending from the cathode to the anode is between approximately 20 µm and 40 µm.

2. The semiconductor diode as claimed in claim 1, wherein the zone substantially adjoins the cathode.

3. The semiconductor diode as claimed in claim 1, wherein the zone has a parallelepipedal form which extends substantially between said cathode and said anode.

4. The semiconductor diode as claimed claim 1, wherein the thickness of the zone is not greater than 60% of the thickness of the semiconductor volume.

5. The semiconductor diode as claimed in claim 4, wherein the thickness of the zone is about one third to one quarter of the thickness of the semiconductor volume.

6. The semiconductor diode as claimed in claim 5, wherein the diode is a 1200 V diode.

7. The semiconductor diode as claimed in claim 1, wherein the diode is a $pn^{-n}$ diode, and the electron mobility or hole mobility is reduced in the vicinity of an n-type emitter of the $pn^{-n}$ diode.

8. A high voltage semiconductor diode comprising:
an anode;
a cathode; and
a semiconductor volume provided between the anode and the cathode, the semiconductor volume including a zone of reduced mobility and a portion outside of the zone of reduced mobility, the zone of reduced mobility being closer to the cathode than the anode, wherein a total thickness of said semiconductor volume between said anode and said cathode corresponds to the blocking capability of the diode in a ratio of approximately 10 μm thickness per 100 volts of reverse voltage blocking capability; and
wherein carrier mobility within the zone of reduced mobility is reduced relative to carrier mobility of the portion outside of the zone of reduced mobility, and wherein a thickness of the zone in the direction extending from the cathode to the anode is between approximately 20 μm and 40 μm.

9. The semiconductor diode as claimed in claim 8, wherein the thickness of the zone of reduced mobility is not greater than 60% of the thickness of the semiconductor volume.

10. The semiconductor diode as claimed in claim 8, wherein electron mobility is reduced in the zone of reduced mobility.

11. The semiconductor diode as claimed in claim 8, wherein hole mobility is reduced in the zone of reduced mobility.

12. A semiconductor diode comprising:
an anode;
a cathode; and
an anode;
a cathode; and
a semiconductor volume provided between the anode and the cathode;
wherein a total thickness of said semiconductor volume between said anode and said cathode corresponds to the blocking capability of the diode in a ratio of approximately 10 μm thickness per 100 volts of reverse voltage blocking capability; and
wherein electron mobility or hole mobility within a zone of the semiconductor volume that is situated in front of the cathode is reduced relative to electron mobility or hole mobility of the rest of the semiconductor volume, and wherein a thickness the zone in the direction extending from the cathode to the anode is at least 20 μm.

13. The semiconductor diode as claimed in claim 12, wherein the zone substantially adjoins the cathode.

14. The semiconductor diode as claimed in claim 12, wherein the zone has a parallelepipedal form which extends substantially between said cathode and said anode.

15. The semiconductor diode as claimed claim 12, wherein the thickness of the zone is not greater than 60% of the thickness of the semiconductor volume.

* * * * *